United States Patent
Yu et al.

(10) Patent No.: US 10,879,177 B2
(45) Date of Patent: Dec. 29, 2020

(54) PVD DEPOSITION AND ANNEAL OF MULTI-LAYER METAL-DIELECTRIC FILM

(71) Applicant: Applied Materials, Inc., Santa Clara, CA (US)

(72) Inventors: Minrui Yu, Sunnyvale, CA (US); Kai Ma, Palo Alto, CA (US); Thomas Kwon, Dublin, CA (US); Kaushal K. Singh, Santa Clara, CA (US); Er-Xuan Ping, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 372 days.

(21) Appl. No.: 14/745,367

(22) Filed: Jun. 19, 2015

(65) Prior Publication Data

US 2016/0372330 A1     Dec. 22, 2016

(51) Int. Cl.
| | |
|---|---|
| *H01L 23/532* | (2006.01) |
| *C23C 28/00* | (2006.01) |
| *H01L 21/768* | (2006.01) |
| *C23C 14/06* | (2006.01) |
| *C23C 16/40* | (2006.01) |

(52) U.S. Cl.
CPC ...... *H01L 23/53266* (2013.01); *C23C 28/322* (2013.01); *C23C 28/34* (2013.01); *C23C 28/345* (2013.01); *H01L 21/76838* (2013.01); *C23C 14/0641* (2013.01); *C23C 16/401* (2013.01)

(58) Field of Classification Search
CPC . C23C 14/0641; C23C 16/401; C23C 28/322; C23C 28/34; C23C 28/345; H01L 21/76838; H01L 23/53266
See application file for complete search history.

(56) References Cited

U.S. PATENT DOCUMENTS

| | | | |
|---|---|---|---|
| 3,852,078 A | * | 12/1974 | Wakatsuki ............... B01J 3/062 501/92 |
| 5,272,367 A | | 12/1993 | Dennison et al. |
| 5,298,328 A | * | 3/1994 | Abe ...................... H01L 23/291 257/E23.118 |
| 5,418,187 A | * | 5/1995 | Miyanaga ......... H01L 21/76882 257/E21.588 |

(Continued)

FOREIGN PATENT DOCUMENTS

| | | |
|---|---|---|
| JP | 2004241679 A | 8/2004 |
| JP | 2005033095 A | 2/2005 |

(Continued)

OTHER PUBLICATIONS

Strain Gauge, Encyclopedia Britannica, https://www.britannica.com/technology/strain-gauge, last visited on Feb. 13, 2019.*

(Continued)

*Primary Examiner* — James M Mellott
(74) *Attorney, Agent, or Firm* — Patterson + Sheridan LLP

(57) ABSTRACT

The present disclosure provides a film stack structure formed on a substrate and methods for forming the film stack structure on the substrate. In one embodiment, the method for forming a film stack structure on a substrate includes depositing a first adhesion layer on an oxide layer formed on the substrate and depositing a metal layer on the first adhesion layer, wherein the first adhesion layer and the metal layer form a stress neutral structure.

19 Claims, 5 Drawing Sheets

(56) References Cited

U.S. PATENT DOCUMENTS

| | | | | |
|---|---|---|---|---|
| 5,505,989 | A | * | 4/1996 | Jenkinson ............ C03C 17/3435 427/165 |
| 6,011,646 | A | * | 1/2000 | Mirkarimi .............. G02B 1/105 359/359 |
| 6,060,178 | A | * | 5/2000 | Krisko .................... C03C 17/36 359/359 |
| 6,437,441 | B1 | * | 8/2002 | Yamamoto ........ H01L 21/76801 257/262 |
| 2002/0006518 | A1 | * | 1/2002 | Lustig .................... B65D 65/42 428/446 |
| 2007/0206263 | A1 | * | 9/2007 | Neuman ................. B60R 1/088 359/267 |
| 2009/0051026 | A1 | | 2/2009 | Chey et al. |
| 2009/0092466 | A1 | * | 4/2009 | Moore .............. H01L 21/67201 414/217 |
| 2012/0038014 | A1 | * | 2/2012 | Tai .................... H01L 27/14638 257/437 |
| 2012/0097234 | A1 | | 4/2012 | Bojarczuk et al. |
| 2013/0102142 | A1 | | 4/2013 | Lee et al. |
| 2014/0291802 | A1 | | 10/2014 | Adderly et al. |

FOREIGN PATENT DOCUMENTS

| | | |
|---|---|---|
| JP | 2009543355 A | 12/2009 |
| TW | I343630 B | 6/2011 |
| WO | 2008005773 A2 | 1/2008 |

OTHER PUBLICATIONS

International Search Report and Written Opinion for Application No. PCT/US2016/035826 dated Aug. 19, 2016.
Doering, Robert, et al., Editors—"Table 13.1—Common CVD Deposition Chemistries," Handbook of Semiconductor Manufacturing Technology, Second Edition, 2008, Chapter 13—Chemical Vapor Deposition, CRC Press, Taylor & Francis Group, Boca Raton, Florida, p. 13.3.
National Institute of Standards and Technology, "Tetraethyl silicate," NIST Chemistry WebBook, SRD, 69, https://webbook.nist.gov/cgi/chook.cgi?ID=C78104, 2017, 3 pages.
Taiwan Office Action dated Feb. 20, 2020. for Taiwan Patent Application No. 105118860.
Japanese Office Action dated Jun. 30, 2020, for Japanese Patent Application No. 2017-565799.

* cited by examiner

PVD DEPOSITION AND ANNEAL OF MULTI-LAYER METAL-DIELECTRIC FILM

BACKGROUND

Field

Embodiments of the present disclosure generally relate to methods for depositing thin metal film on dielectrics to form multiple structures of metal-dielectrics, and more particularly to methods for forming a film stack wherein the film stack includes a thin metal film.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

Thus, there is a need for improved methods for forming interconnects to continue to decrease the manufacturing costs, memory cell size, and power consumption of the integrated circuits.

SUMMARY

In one embodiment, a method for forming a film stack on a substrate is disclosed herein. The method includes depositing a first adhesion layer on an oxide layer formed on the substrate, and depositing a metal layer on the first adhesion layer, wherein the first adhesion layer and the metal layer form a stress neutral structure.

In another embodiment, a film stack structure formed on a substrate is disclosed herein. The film stack structure includes a first adhesion layer and a metal layer. The first adhesion layer is deposited on an oxide layer formed on the substrate. The metal layer is deposited on the adhesion layer. The first adhesion layer and the metal layer form a stress neutral structure.

In one embodiment, a method for forming a film stack on a substrate is disclosed herein. The method includes depositing a first adhesion layer on an oxide layer formed on the substrate, depositing a metal layer on the first adhesion layer, and depositing a second adhesion layer on the metal layer wherein the first adhesion layer, the metal layer, and the second adhesion layer form a stress neutral structure.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

A method for forming a film stack on a substrate is disclosed herein. The method includes depositing a first adhesion layer on an oxide layer formed on the substrate, and depositing a metal layer on the first adhesion layer, wherein the first adhesion layer and the metal layer form a stress neutral structure.

Figure 1:
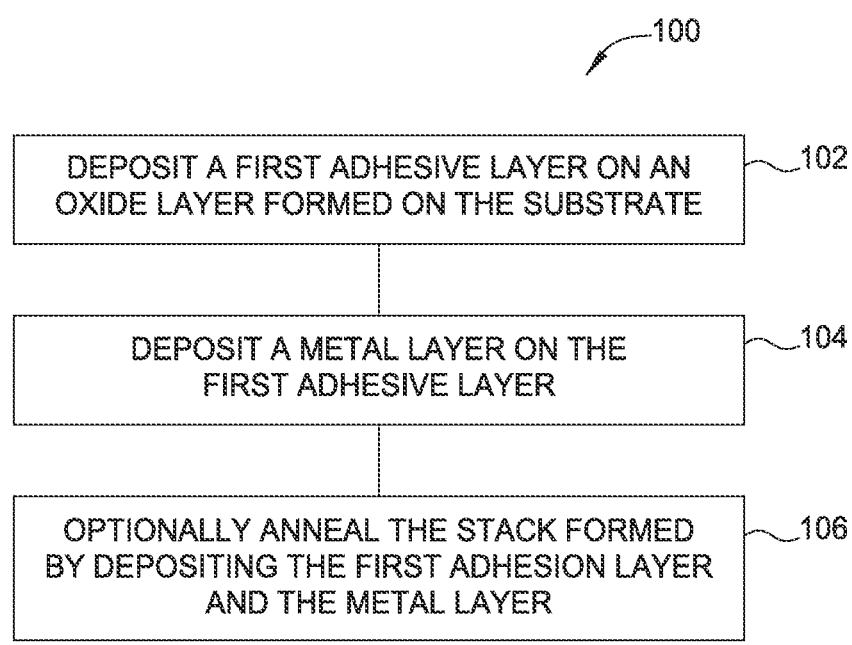
FIG. 1 depicts a method of forming a film stack on a substrate, according to one embodiment.

FIG. 1 illustrates one embodiment of a method 100 for forming a film stack on a substrate. FIGS. 2A-2D illustrate cross-sectional views of the substrate at different stages of the method of FIG. 1. FIG. 2A depicts a substrate 200 having an oxide layer 202 formed on the substrate 200. The oxide layer 202 may be deposited on the substrate through plasma-enhanced chemical vapor deposition (PECVD) or physical vapor deposition (PVD). The oxide layer 202, for example, may be made from tetraethylorthosilicate (TEOS), to form a TEOS layer. The oxide layer 202 has a thickness 205. In one embodiment, the thickness 205 of the oxide layer 202 may be no greater than 250 A.

Figure 2B:
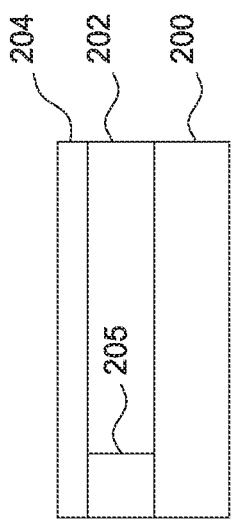
FIGS. 2A-2D illustrate a film stack formed on a substrate at intervals of the method in FIG. 1.

Method 100 begins at block 102 by depositing a first adhesion layer 204 on the oxide layer 202, as shown in FIG. 2B. The first adhesion layer 204 may be deposited using a physical vapor deposition or other suitable process. The first adhesion layer 204 may be a nitride film. For example, the first adhesion layer 204 may be titanium nitride (TiN) or tungsten-nitride (WN).

Figure 2D:
Figure 2A:
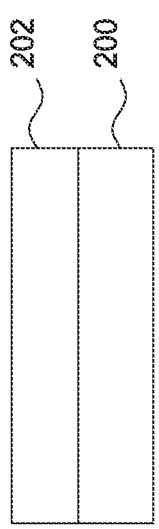
Figure 2C:
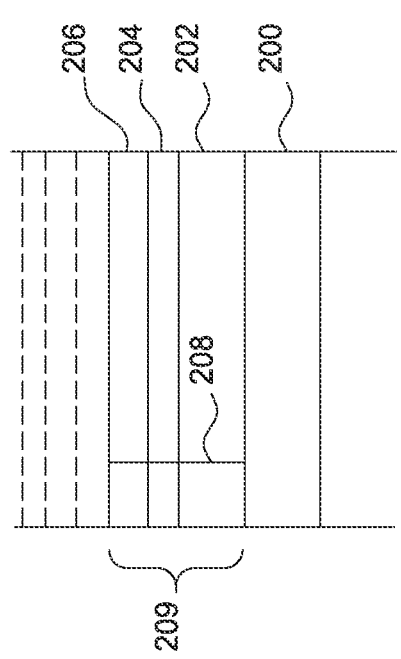

At block 104, a metal layer 206 is deposited over the surface of the first adhesion layer 204, as shown in FIG. 2C. The metal layer 206 may be deposited using a PVD process or other suitable process. The metal layer 206 may be, for example, tungsten (W). In one embodiment, the metal layer 206 has a sheet resistance of less than 150Ω/☐.

The first adhesion layer 204 and the metal layer 206 form a stress neutral structure. For example, in one embodiment, the first adhesion layer 204 exhibits compressive stress, meaning that force pushes against the underlying substrate, while the metal layer 206 exhibits tensile stress, meaning the force pulls on the underlying substrate. In another embodiment, the first adhesion layer 204 exhibits tensile stress and the metal layer 206 exhibits compressive stress.

The first adhesion layer 204 and the metal layer 206 may have a total thickness 208 not exceeding 200 A. For example, in one embodiment, a bilayer of WN and W may be deposited on the oxide layer 202 such that the WN layer has a thickness of 40 A and the W layer has a thickness of 160 A.

The metal layer 206, the first adhesion layer 204, and the oxide layer 202 are collectively referred to as an oxide-metal (OM) structure 209. Each OM structure 209 is formed such that the resulting substrate bow of each OM structure 209 is less than 1 µm, as shown in FIG. 2D. The less than 1 µm substrate bow is due to the stress neutral structure formed by the first adhesion layer 204 and the metal layer 206. As the force of the first adhesion layer 204 pushes against the substrate 200, the force of the metal layer 206 pulls on the substrate 200. By adjusting the thickness of the first adhesion layer 204 and the thickness of the metal layer 206, the forces may nearly cancel, resulting in a substrate bow of less than 1 µm.

At block 106, the film stack is optionally transferred to an anneal chamber for an anneal process. Annealing the film stack may further reduce the bow of the substrate and the resistance of the metal layer 206. For example, in one embodiment, the film stack may be annealed for two hours at 500° C. In another embodiment, the film stack may be annealed for a shorter duration at a higher temperature.

Figure 3:
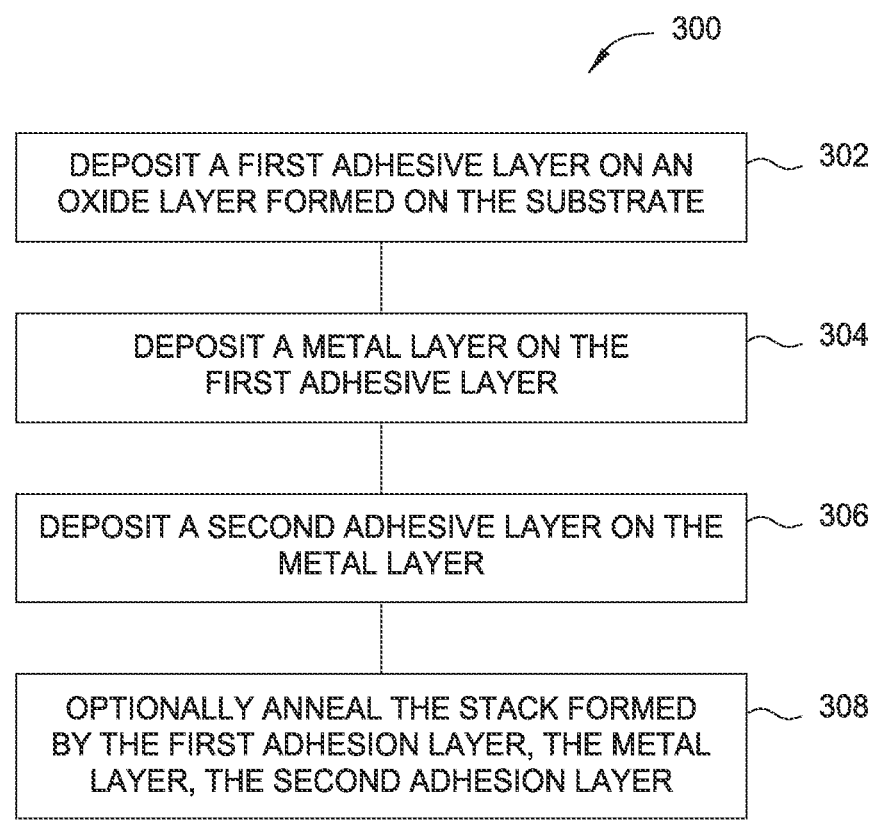
FIG. 3 depicts a method of forming a film stack on a substrate, according to one embodiment.

FIG. 3 illustrates one embodiment of a method 300 for forming a film stack on a substrate. FIGS. 4A-4E illustrate cross-sectional views of a substrate at different stages of the method 300 of FIG. 3. FIG. 4A depicts a substrate 400 having an oxide layer 402 formed on the substrate 400. The oxide layer 402 may be deposited on the substrate through a PECVD process. For example, the oxide layer may be a TEOS layer. The oxide layer 402 has a thickness 405. In one embodiment, the thickness 405 of the oxide layer 402 may be no greater than 250 A.

Figure 4B:
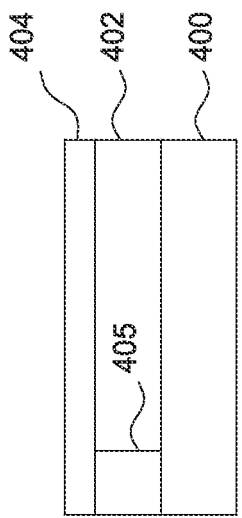
FIG. 4A-4E illustrate a film stack formed on a substrate at intervals of the method in FIG. 3.
Figure 4A:
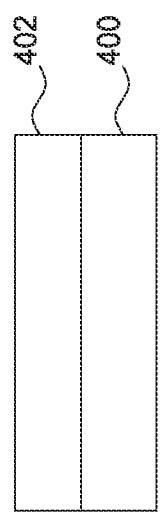

Method 300 begins at block 302 by depositing a first adhesion layer 404 on the oxide layer 402, as illustrated in FIG. 4B. The first adhesion layer 404 may be deposited using a PVD or other suitable process. The first adhesion layer 404 may be a nitride film. For example, the first adhesion layer 404 may be TiN or WN.

Figure 4D:
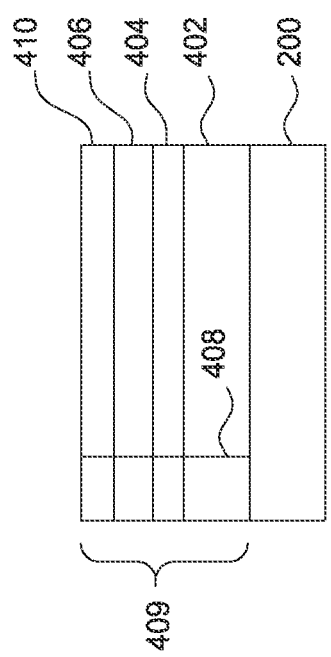
Figure 4C:
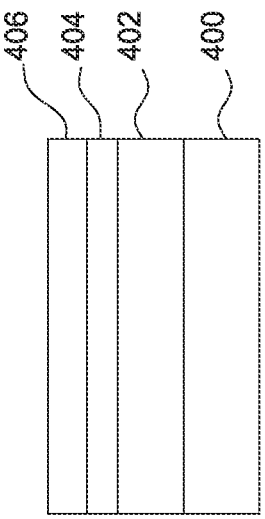

At block 304, a metal layer 406 is deposited over the surface of the first adhesion layer 404, as illustrated in FIG. 4C. The metal layer 406 may be deposited using a PVD process or other suitable process. The metal layer 406 may be, for example, W. In one embodiment, the metal layer 406 has a sheet resistance less than 15Ω/☐.

At block 306, a second adhesion layer 410 is deposited on the metal layer 406, as illustrated in FIG. 4D. The second adhesion layer 410 may be deposited using a PVD or other suitable process. The second adhesion layer 410 may be a nitride film. For example, the second adhesion layer 410 may be TiN or WN. In one embodiment, the second adhesion layer 410 may be the same as the first adhesion layer 404. For example, the first adhesion layer 404 and the second adhesion layer 410 are WN. In another embodiment, the first adhesion layer 404 and the second adhesion layer 410 may be different materials.

The first adhesion layer 404, the metal layer 406, and the second adhesion layer 410 form a stress neutral structure. For example, in one embodiment, the first adhesion layer 404 and the second adhesion layer 410 may exhibit compressive stress, while the metal layer 406 exhibits tensile stress. In another embodiment, the first adhesion layer 404 and the second adhesion layer 410 may exhibit tensile stress and the metal layer 406 exhibits compressive stress. For example, the first adhesion layer 404 and the second adhesion layer 410 may be TiN, which exhibits compressive stress, meaning that force pushes on the underlying substrate. The metal layer 406 may be W, which exhibits tensile stress, meaning the force pulls against the underlying substrate.

The first adhesion layer 404, metal layer 406, and the second adhesion layer 410 may have a total thickness 408 not exceeding 200 A. For example, in one embodiment, a tri-layer of TiN/W/TiN may be deposited on the oxide layer 402 such that the TiN layers have thicknesses of 30 A each and the W layer has a thickness of 140 A.

Figure 4E:

The first adhesion layer 404, the metal layer 406, the second adhesion layer 410, and the oxide layer 402 are collectively referred to as an oxide-metal (OM) structure 409. Each OM structure 409 is formed such that the resulting substrate bow of each OM structure 409 is less than 1 µm, as illustrated in FIG. 4E. The less than 1 µm substrate bow is due to the stress neutral structure formed by the first adhesion layer 404, the metal layer 406, and the second adhesion layer 410. As the force of the first adhesion layer 404 pulls on the substrate 400, the force of the metal layer 406 pushes on the substrate 400, and the force of the second adhesion layer 410 pulls on the substrate 400. By adjusting the thickness of the first adhesion layer 404, the thickness of the metal layer 406, and the thickness of the second adhesion layer 410, the forces may cancel, resulting in a substrate bow of less than 1 µm per OM structure 409.

At block 308, the film stack is optionally transferred to an anneal chamber for an anneal process. Annealing the film stack may further reduce the bow of the substrate and the sheet resistance of the metal layer 406. For example, in one embodiment, the film stack may be annealed for two hours at 500° C. In another embodiment, the film stack may be annealed for a shorter duration at a higher temperature.

Figure 5:
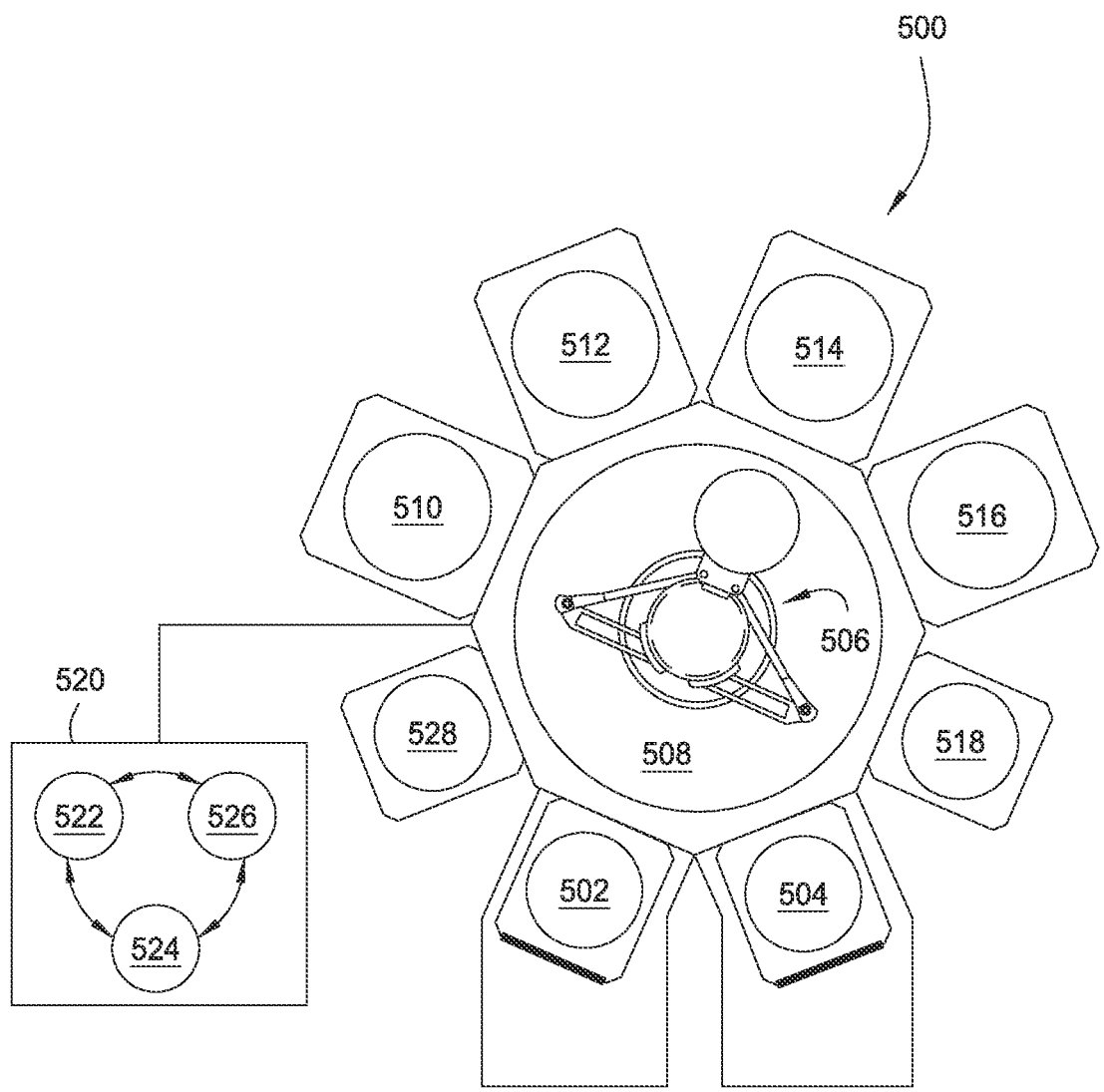
FIG. 5 illustrates a processing system for forming a film stack on a substrate, according to one embodiment.

FIG. 5 illustrates a multi-chamber processing system 500. The processing system 500 may include load lock chambers 502, 504, a robot 506, a transfer chamber 508, processing chambers 510, 512, 514, 516, 518, 528, and a controller 520. The load lock chambers 502, 504 allow for the transfer of substrates (not shown) into and out of the processing system 500. Load lock chambers 502, 504 may pump down the substrates introduced into the processing system 500 to maintain a vacuum seal. The robot 506 may transfer the substrates between load lock chambers 502, 504 and the processing chambers 510, 512, 514, 516, 518, and 528. The robot 506 may also transfer the substrates between the load lock chambers 502, 504 and the transfer chamber 508.

Each processing chamber 510, 512, 514, 516, 518, and 528 may be outfitted to perform a number of substrate operations such as atomic layer deposition (ALD), chemical vapor deposition (CVD), PVD, etch, pre-clean, de-gas, heat, orientation, or other substrate processes. Additionally, each processing chamber 510, 512, 514, 516, 518, and 528 may be outfitted to deposit an oxide layer, a first adhesion layer, a metal layer, or a second adhesion layer.

The controller 520 may be configured to operate all aspects of the processing system 500, such as the methods disclosed in FIG. 1 and FIG. 3. For example, the controller 520 may be configured to control the method of forming a metal interconnect on a substrate. The controller 520 includes a programmable central processing unit (CPU) 522 that is operable with a memory 524 and a mass storage device, an input control unit, and a display unit (not shown), such as power supplies, clocks, cache, input/output (I/O) circuits, and the liner, coupled to the various components of the processing system to facilitate control of the substrate processing. The controller 520 also includes hardware for monitoring substrate processing through sensors in the processing system 500, including sensors monitoring the precursor, process gas, and purge gas flow. Other sensors that measure system parameters, such as substrate temperature, chamber atmosphere pressure, and the like, may also provide information to the controller 520.

To facilitate control of the processing system 500 described above, the CPU 522 may be one of any form of general purpose computer processor that can be used in an industrial setting, such as a programmable logic controller (PLC), for controlling various chambers and sub-processors. The memory 524 is coupled to the CPU 522 and the memory 524 is non-transitory and may be one or more of readily available memory such as random access memory (RAM), read only memory (ROM), floppy disk drive, hard disk, or any other form of digital storage, local or remote. Support circuits 526 are coupled to the CPU 522 for supporting the processor in a conventional manner. Charged species generation, heating, and other processes are generally stored in the memory 524, typically as software routine. The software routine may also be stored and/or executed by a second CPU (not shown) that is remotely located from the hardware being controlled by the CPU 522.

The memory 524 is in the form of computer-readable storage media that contains instructions, that when executed by the CPU 522, facilitates the operation of the processing system 500. The instructions in the memory 524 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Example 1

The following example may be carried out using the processing chamber described in FIG. 5. A substrate is transferred to a first processing chamber for deposition of an oxide layer. The first processing chamber is a PECVD chamber configured to deposit TEOS on the substrate. The TEOS layer has a thickness of 250 A. The TEOS layer is deposited through a PECVD process. The deposited TEOS has a thickness of 250 A.

The robot transfers the substrate having the TEOS layer deposited thereon to a second processing chamber for deposition of a first adhesion layer. The second processing chamber is a PVD chamber configured to deposit a layer of WN on the TEOS layer. The layer of WN has a thickness of 40 A. The WN may be deposited at a rate of 5.0 A/s. The WN layer exhibits compressive stress.

The robot transfers the substrate having the first adhesion layer deposited thereon to a third processing chamber for deposition of a metal layer. The third processing chamber is a CVD chamber configured to deposit a layer of W on the WN adhesion layer. The layer of W has a thickness of 160 A. The W layer exhibits tensile stress. The W may be deposited at a rate of 17.6 Ns. The TEOS layer, the WN layer, and the W layer are collectively referred to as an OM structure.

The robot transfers the substrate among the processing chambers until the desired number of OM structures is deposited on the substrate. For example, 120 OM structures may be deposited on the substrate. Each OM structure has a substrate bow less than 1 μm due to the stress neutral structure formed by the WN layer and the W layer. Thus, the total substrate bow of the 120 OM structures is less than 120 μm.

After the film stack of 120 OM structures is deposited on the substrate, the substrate may be transferred out of the processing system and into a chamber for annealing. Annealing the film stack formed on the substrate can reduce the substrate bow further as well as the sheet resistance of the metal layer. The film stack is annealed for two hours at 500° C.

Example 2

The following example may be carried out using the processing chamber described in FIG. 5. A substrate is transferred to a first processing chamber for deposition of an oxide layer. The first processing chamber is a PECVD chamber configured to deposit TEOS on the substrate. The TEOS layer has a thickness of 250 A. The TEOS layer is deposited through a PECVD process. The deposited TEOS has a thickness of 250 A.

The robot transfers the substrate having the TEOS layer deposited thereon to a second processing chamber for deposition of a first adhesion layer. The second processing chamber is a low-powered radio frequency PVD (LP RFPVD) chamber configured to deposit a layer of TiN on the TEOS layer. The layer of TiN has a thickness of 60 A. The TiN may be deposited at a rate of 0.5 A/s. The TiN layer exhibits compressive stress.

The robot transfers the substrate having the first adhesion layer deposited thereon to a third processing chamber for deposition of a metal layer. The third processing chamber is a PVD chamber configured to deposit a layer of W on the TiN adhesion layer. The layer of W has a thickness of 140 A. The W may be deposited at a rate of 17.6 Ns. The W layer exhibits tensile stress.

The TEOS layer, the TiN layer, and the W layer are collectively referred to as an OM structure. The robot transfers the substrate among the processing chambers until the desired number of OM structures is deposited on the substrate. For example, 120 OM structures may be deposited on the substrate. Each OM structure has a substrate bow less than 1 μm due to the stress neutral structure formed by the TiN layer and the W layer. Thus, the total substrate bow of the 120 OM structures is less than 120 μm.

Example 3

The following example may be carried out using the processing chamber described in FIG. 5. A substrate is transferred to a first processing chamber for deposition of an oxide layer. The first processing chamber is a PECVD chamber configured to deposit TEOS on the substrate. The TEOS layer has a thickness of 250 A. The TEOS layer is deposited through a PECVD process. The deposited TEOS has a thickness of 250 A.

The robot transfers the substrate having the TEOS layer deposited thereon to a second processing chamber for deposition of a first adhesion layer. The second processing chamber is a PVD chamber configured to deposit a layer of WN on the TEOS layer. The layer of WN has a thickness of 30 A. The WN may be deposited at a rate of 5.0 A/s. The first WN layer exhibits compressive stress.

The robot transfers the substrate having the first adhesion layer deposited thereon to a third processing chamber for deposition of a metal layer. The third processing chamber is a CVD chamber configured to deposit a layer of W on the WN adhesion layer. The layer of W has a thickness of 140 A. The W may be deposited at a rate of 17.6 Ns. The W layer exhibits tensile stress.

The robot transfers the substrate having the metal layer deposited thereon to a fourth processing chamber for deposition of a second adhesion layer. The fourth processing chamber is a PVD chamber configured to deposit a second layer of WN on the metal W layer. The layer of WN has a thickness of 30 A. The WN may be deposited at a rate of 5.0 Ns. The second WN layer exhibits compressive stress.

The TEOS layer, the first WN layer, the W layer, and the second WN layer are collectively referred to as an OM structure. The robot transfers the substrate among the processing chambers until the desired number of OM structures is deposited on the substrate. For example, 120 OM structures may be deposited on the substrate. Each OM structure has a substrate bow less than 1 μm, due to the stress neutral structure formed by the first WN layer, the W layer, and the second WN layer. Thus, the total substrate bow of the 120 OM structures is less than 120 μm.

After the film stack of 120 OM structures is deposited on the substrate, the substrate may be transferred out of the processing system and into a chamber for annealing. The film stack is annealed for two hours at 500° C.

While the foregoing is directed to embodiments of the present invention, other and further embodiments of the invention may be devised without departing from the basic scope thereof, and the scope thereof is determined by the claims that follow.

What is claimed is:

1. A method for forming a film stack on a substrate, comprising:
   forming a plurality of oxide metal structures comprising sequential repetitions of:
   depositing an oxide layer using tetraethylorthosilicate (TEOS), the oxide layer having a first thickness of less than or equal to 250 Å;
   depositing an adhesion layer comprising tungsten nitride on the oxide layer; and
   depositing a metal layer comprising tungsten on the adhesion layer, wherein the adhesion layer and the metal layer form a stress neutral structure having a second thickness less than or equal to 200 Å, wherein each layer of the plurality of oxide metal structures is deposited using one of a plurality of processing chambers of a multi-chamber system, and wherein the plurality of oxide metal structures are sequentially formed before the substrate is removed from the multi-chamber system.

2. The method of claim 1, wherein the film stack contains at least 50 layers.

3. The method of claim 2, wherein each adhesion layer has a thickness less than 40 Å.

4. The method of claim 1, further comprising:
   annealing the film stack formed on the substrate by heating the substrate to at least 500° C.

5. The method of claim 1, wherein each oxide metal structure causes less than 1 μm of substrate bow.

6. The method of claim 1, wherein the adhesion layer consists essentially of tungsten nitride and the metal layer consists essentially of tungsten.

7. A method for forming a film stack on a substrate, comprising:
   using a first processing chamber of a plurality of processing chambers to deposit an oxide layer on the substrate, wherein the oxide layer has a thickness less than or equal to 250 Å;
   using a second processing chamber of the plurality of processing chambers to deposit a first metal nitride adhesion layer comprising tungsten nitride or titanium nitride on the oxide layer;
   using a third processing chamber of the plurality of processing chambers to deposit a tungsten layer on the first metal nitride adhesion layer;
   forming a stress neutral structure by using a fourth processing chamber of the plurality of processing chambers to deposit a second metal nitride adhesion layer on the tungsten layer, wherein the first and second metal nitride adhesion layers and the tungsten layer have a combined thickness less than or equal to 200 Å, wherein the plurality of processing chambers are fluidly coupled by one or more transfer chambers to form a multi-chamber processing system; and
   forming a plurality of oxide metal structures by repeating sequential depositions of the oxide layer, the first metal nitride adhesion layer, the tungsten layer, and the second metal nitride adhesion layer, wherein forming the plurality of oxide metal structures comprises transferring the substrate between the plurality of processing chambers before removing the substrate from the multi-chamber processing system.

8. The method of claim 7, further comprising:
   annealing the film stack formed on the substrate by heating the substrate to a temperature of at least 500° C.

9. The method of claim 7, further comprising:
   depositing the oxide layer using a tetraethylorthosilicate (TEOS) precursor.

10. The method of claim 9, wherein each of the first and second metal nitride adhesion layers has a thickness less than 40 Å.

11. The method of claim 7, wherein the first metal nitride adhesion layer is the same material as the second metal nitride adhesion layer.

12. The method of claim 9, wherein each oxide metal structure causes less than 1 μm of substrate bow.

13. The method of claim 9, wherein the film stack contains at least 50 layers.

14. A method for forming a film stack on a substrate, comprising sequentially:
- depositing, using a first processing chamber of a multi-chamber system, a first adhesion layer consisting essentially of tungsten nitride or titanium nitride;
- depositing, using a second processing chamber of the multi-chamber system, a tungsten layer on the first adhesion layer;
- forming a stress neutral structure by depositing, using a third processing chamber of the multi-chamber system, a second adhesion layer on the tungsten layer, wherein the first and second adhesion layers consist of essentially the same material, and wherein the first and second adhesion layers and the tungsten layer have a combined thickness of less than or equal to 200 Å;
- transferring the substrate from the third processing chamber to a fourth processing chamber of the multi-chamber system without removing the substrate from the multi-chamber system; and
- depositing, using the fourth processing chamber, an oxide layer on the second adhesion layer, wherein the oxide layer is deposited to a thickness of less than 250 Å using tetraethylorthosilicate (TEOS).

15. The method of claim 14, further comprising forming a plurality of oxide metal structures by repeated the sequential deposition of, the first adhesion layer, the tungsten layer, the second adhesion layer, and the oxide layer.

16. The method of claim 15, wherein forming the plurality of oxide metal structures comprises forming at least 50 layers.

17. The method of claim 15, wherein each oxide metal structure of the plurality of oxide metal structures causes less than 1 μm of substrate bow.

18. The method of claim 14, wherein each adhesion layer has a thickness less than 40 Å.

19. The method of claim 14, further including annealing the film stack by heating the substrate to a temperature of at least 500° C.

* * * * *

UNITED STATES PATENT AND TRADEMARK OFFICE
CERTIFICATE OF CORRECTION

PATENT NO. : 10,879,177 B2
APPLICATION NO. : 14/745367
DATED : December 29, 2020
INVENTOR(S) : Minrui Yu et al.

Page 1 of 1

It is certified that error appears in the above-identified patent and that said Letters Patent is hereby corrected as shown below:

On the Title Page

On the page 2, in Column 2, under "Other Publications", Line 10, delete "chook." and insert -- ebook. --, therefor.

In the Specification

In Column 2, Line 25, delete "FIG." and insert -- FIGS. --, therefor.

In Column 3, Line 6, delete "150Ω/□." and insert -- 15Ω/□. --, therefor.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*